United States Patent
Mullen et al.

(10) Patent No.: US 9,916,992 B2
(45) Date of Patent: Mar. 13, 2018

(54) SYSTEMS AND METHODS FOR FLEXIBLE COMPONENTS FOR POWERED CARDS AND DEVICES

(71) Applicants: Jeffrey D. Mullen, Pittsburgh, PA (US); Norman E. O'Shea, Seven Fields, PA (US)

(72) Inventors: Jeffrey D. Mullen, Pittsburgh, PA (US); Norman E. O'Shea, Seven Fields, PA (US)

(73) Assignee: DYNAMICS INC., Pittsburgh, PA (US)

( * ) Notice: Subject to any disclaimer, the term of this patent is extended or adjusted under 35 U.S.C. 154(b) by 0 days.

(21) Appl. No.: 13/770,484

(22) Filed: Feb. 19, 2013

(65) Prior Publication Data

US 2013/0217152 A1    Aug. 22, 2013

Related U.S. Application Data

(60) Provisional application No. 61/600,950, filed on Feb. 20, 2012.

(51) Int. Cl.
*H01L 21/00* (2006.01)
*H01L 21/56* (2006.01)
(Continued)

(52) U.S. Cl.
CPC .......... *H01L 21/56* (2013.01); *G11B 5/00808* (2013.01); *H01L 21/02* (2013.01);
(Continued)

(58) Field of Classification Search
CPC ........... H01L 21/56; H01L 2224/16145; H01L 2224/73265; H05K 1/189
(Continued)

(56) References Cited

U.S. PATENT DOCUMENTS 4,353,064 A    10/1982    Stamm
4,394,654 A    7/1983    Hofmann-Cerfontaine
(Continued)

FOREIGN PATENT DOCUMENTS

JP    05210770 A    8/1993
WO    WO9852735    11/1998
(Continued)

OTHER PUBLICATIONS

Brian Holland et al., Ultra-Thin, Flexible Electronics, 2008, 2008 Electronic Component and Technology Conference, pp. 1110-1116.*
(Continued)

*Primary Examiner* — Reema Patel
*Assistant Examiner* — Syed Gheyas

(57) ABSTRACT

Die may be thinned using a thinning and/or a polishing process. Such thinned die may be flexible and may change operational characteristics when flexed. The flexible die may be applied to a mechanical carrier (e.g., a PCB) of a card or device. Detection circuitry may also be provided on the PCB and may be used to detect changed operational characteristics. Such detection circuitry may cause a reaction to the changed characteristics by controlling other components on the card or device based upon the flex-induced changed characteristics. The thinned die may be stacked, interconnected, and encapsulated between sheets of laminate material to form a flexible card or device.

5 Claims, 6 Drawing Sheets

(51) Int. Cl.
*H01L 21/02* (2006.01)
*H01L 21/66* (2006.01)
*G11B 5/008* (2006.01)
*H05K 1/18* (2006.01)

(52) U.S. Cl.
CPC .... *H01L 22/10* (2013.01); *H01L 2224/16145* (2013.01); *H01L 2224/16225* (2013.01); *H01L 2224/48091* (2013.01); *H01L 2224/48145* (2013.01); *H01L 2224/73265* (2013.01); *H05K 1/189* (2013.01); *H05K 2201/10674* (2013.01); *H05K 2203/049* (2013.01)

(58) Field of Classification Search
USPC ........ 438/5, 107, 127, 800; 257/99, 100, 98, 257/678, 741, 777, 784, E21.509, 257/E23.141, E25.013
See application file for complete search history.

(56) References Cited

U.S. PATENT DOCUMENTS

| | | |
|---|---|---|
| 4,614,861 A | 9/1986 | Pavlov et al. |
| 4,667,087 A | 5/1987 | Quintana |
| 4,701,601 A | 10/1987 | Francini et al. |
| 4,720,860 A | 1/1988 | Weiss |
| 4,786,791 A | 11/1988 | Hodama |
| 4,791,283 A | 12/1988 | Burkhardt |
| 4,797,542 A | 1/1989 | Hara |
| 5,038,251 A | 8/1991 | Sugiyama et al. |
| 5,168,520 A | 12/1992 | Weiss |
| 5,237,614 A | 8/1993 | Weiss |
| 5,276,311 A | 1/1994 | Hennige |
| 5,347,580 A | 9/1994 | Molva et al. |
| 5,361,062 A | 11/1994 | Weiss et al. |
| 5,412,199 A | 5/1995 | Finkelstein et al. |
| 5,434,398 A | 7/1995 | Goldberg |
| 5,434,405 A | 7/1995 | Finkelstein et al. |
| 5,478,994 A | 12/1995 | Rahman |
| 5,479,512 A | 12/1995 | Weiss |
| 5,484,997 A | 1/1996 | Haynes |
| 5,485,519 A | 1/1996 | Weiss |
| 5,585,787 A | 12/1996 | Wallerstein |
| 5,591,949 A | 1/1997 | Bernstein |
| 5,608,203 A | 3/1997 | Finkelstein et al. |
| 5,623,552 A | 4/1997 | Lane |
| 5,657,388 A | 8/1997 | Weiss |
| 5,834,747 A | 11/1998 | Cooper |
| 5,834,756 A | 11/1998 | Gutman et al. |
| 5,856,661 A | 1/1999 | Finkelstein et al. |
| 5,864,623 A | 1/1999 | Messina et al. |
| 5,866,949 A | 2/1999 | Schueller et al. |
| 5,907,142 A | 5/1999 | Kelsey |
| 5,913,203 A | 6/1999 | Wong et al. |
| 5,937,394 A | 8/1999 | Wong et al. |
| 5,955,021 A | 9/1999 | Tiffany, III |
| 5,956,699 A | 9/1999 | Wong et al. |
| 6,025,054 A | 2/2000 | Tiffany, III |
| 6,045,043 A | 4/2000 | Bashan et al. |
| 6,076,163 A | 6/2000 | Hoffstein et al. |
| 6,085,320 A | 7/2000 | Kaliski |
| 6,095,416 A | 8/2000 | Grant et al. |
| 6,130,621 A | 10/2000 | Weiss |
| 6,145,079 A | 11/2000 | Mitty et al. |
| 6,157,920 A | 12/2000 | Jakobsson et al. |
| 6,161,181 A | 12/2000 | Haynes, III et al. |
| 6,176,430 B1 | 1/2001 | Finkelstein et al. |
| 6,182,894 B1 | 2/2001 | Hackett et al. |
| 6,189,098 B1 | 2/2001 | Kaliski |
| 6,199,052 B1 | 3/2001 | Mitty et al. |
| 6,206,293 B1 | 3/2001 | Gutman et al. |
| 6,240,184 B1 | 5/2001 | Huynh et al. |
| 6,241,153 B1 | 6/2001 | Tiffany, III |
| 6,256,873 B1 | 7/2001 | Tiffany, III |
| 6,269,163 B1 | 7/2001 | Rivest et al. |
| 6,286,022 B1 | 9/2001 | Kaliski et al. |
| 6,308,890 B1 | 10/2001 | Cooper |
| 6,313,724 B1 | 11/2001 | Osterweil |
| 6,389,442 B1 | 5/2002 | Yin et al. |
| 6,393,447 B1 | 5/2002 | Jakobsson et al. |
| 6,411,715 B1 | 6/2002 | Liskov et al. |
| 6,446,052 B1 | 9/2002 | Juels |
| 6,460,141 B1 | 10/2002 | Olden |
| 6,592,044 B1 | 7/2003 | Wong et al. |
| 6,607,127 B2 | 8/2003 | Wong |
| 6,609,654 B1 | 8/2003 | Anderson et al. |
| 6,631,849 B2 | 10/2003 | Blossom |
| 6,655,585 B2 | 12/2003 | Shinn |
| 6,681,988 B2 | 1/2004 | Stack et al. |
| 6,705,520 B1 | 3/2004 | Pitroda et al. |
| 6,755,341 B1 | 6/2004 | Wong et al. |
| 6,764,005 B2 | 7/2004 | Cooper |
| 6,769,618 B1 | 8/2004 | Finkelstein |
| 6,805,288 B2 | 10/2004 | Routhenstein et al. |
| 6,811,082 B2 | 11/2004 | Wong |
| 6,813,354 B1 | 11/2004 | Jakobsson et al. |
| 6,817,532 B2 | 11/2004 | Finkelstein |
| 6,873,974 B1 | 3/2005 | Schutzer |
| 6,902,116 B2 | 6/2005 | Finkelstein |
| 6,970,070 B2 | 11/2005 | Juels et al. |
| 6,980,969 B1 | 12/2005 | Tuchler et al. |
| 6,985,583 B1 | 1/2006 | Brainard et al. |
| 6,991,155 B2 | 1/2006 | Burchette, Jr. |
| 7,013,030 B2 | 3/2006 | Wong et al. |
| 7,035,443 B2 | 4/2006 | Wong |
| 7,039,223 B2 | 5/2006 | Wong |
| 7,044,394 B2 | 5/2006 | Brown |
| 7,051,929 B2 | 5/2006 | Li |
| 7,083,094 B2 | 8/2006 | Cooper |
| 7,100,049 B2 | 8/2006 | Gasparini et al. |
| 7,100,821 B2 | 9/2006 | Rasti |
| 7,111,172 B1 | 9/2006 | Duane et al. |
| 7,114,652 B2 | 10/2006 | Moullette et al. |
| 7,122,447 B2 | 10/2006 | Abe |
| 7,136,514 B1 | 11/2006 | Wong |
| 7,140,550 B2 | 11/2006 | Ramachandran |
| 7,163,153 B2 | 1/2007 | Blossom |
| 7,195,154 B2 | 3/2007 | Routhenstein |
| 7,197,639 B1 | 3/2007 | Juels et al. |
| 7,219,368 B2 | 5/2007 | Juels et al. |
| 7,225,537 B2 | 6/2007 | Reed |
| 7,225,994 B2 | 6/2007 | Finkelstein |
| 7,246,752 B2 | 7/2007 | Brown |
| 7,298,243 B2 | 11/2007 | Juels et al. |
| 7,334,732 B2 | 2/2008 | Cooper |
| 7,337,326 B2 | 2/2008 | Palmer et al. |
| 7,346,775 B2 | 3/2008 | Gasparini et al. |
| 7,356,696 B1 | 4/2008 | Jakobsson et al. |
| 7,357,319 B1 | 4/2008 | Lin et al. |
| 7,359,507 B2 | 4/2008 | Kaliski |
| 7,360,688 B1 | 4/2008 | Harris |
| 7,363,494 B2 | 4/2008 | Brainard et al. |
| 7,365,371 B2 * | 4/2008 | Andrews .................. 257/99 |
| 7,380,710 B2 | 6/2008 | Brown |
| 7,398,253 B1 | 7/2008 | Pinnell |
| 7,400,135 B1 * | 7/2008 | Bartholomew et al. . 324/763.01 |
| 7,404,087 B2 | 7/2008 | Teunen |
| 7,424,570 B2 | 9/2008 | D'Albore et al. |
| 7,427,033 B1 | 9/2008 | Roskind |
| 7,454,349 B2 | 11/2008 | Teunen et al. |
| 7,461,250 B1 | 12/2008 | Duane et al. |
| 7,461,399 B2 | 12/2008 | Juels et al. |
| 7,472,093 B2 | 12/2008 | Juels |
| 7,472,829 B2 | 1/2009 | Brown |
| 7,494,055 B2 | 2/2009 | Fernandes et al. |
| 7,502,467 B2 | 3/2009 | Brainard et al. |
| 7,502,933 B2 | 3/2009 | Jakobsson et al. |
| 7,503,485 B1 | 3/2009 | Routhenstein |
| 7,516,492 B1 | 4/2009 | Nisbet et al. |
| 7,523,301 B2 | 4/2009 | Nisbet et al. |
| 7,530,495 B2 | 5/2009 | Cooper |
| 7,532,104 B2 | 5/2009 | Juels |
| 7,543,739 B2 | 6/2009 | Brown et al. |
| 7,559,464 B2 | 7/2009 | Routhenstein |

(56) References Cited

U.S. PATENT DOCUMENTS

| | | |
|---|---|---|
| 7,562,221 B2 | 7/2009 | Nystrom et al. |
| 7,562,222 B2 | 7/2009 | Gasparini et al. |
| 7,580,898 B2 | 8/2009 | Brown et al. |
| 7,584,153 B2 | 9/2009 | Brown et al. |
| 7,591,426 B2 | 9/2009 | Osterweil et al. |
| 7,591,427 B2 | 9/2009 | Osterweil |
| 7,602,904 B2 | 10/2009 | Juels et al. |
| 7,631,804 B2 | 12/2009 | Brown |
| 7,639,537 B2 | 12/2009 | Sepe et al. |
| 7,641,124 B2 | 1/2010 | Brown et al. |
| 7,660,902 B2 | 2/2010 | Graham et al. |
| 7,828,207 B2 | 11/2010 | Cooper |
| 8,011,577 B2 | 9/2011 | Mullen et al. |
| 2001/0034702 A1 | 10/2001 | Mockett et al. |
| 2001/0047335 A1 | 11/2001 | Arndt et al. |
| 2002/0059114 A1 | 5/2002 | Cockrill et al. |
| 2002/0082989 A1 | 6/2002 | Fife et al. |
| 2002/0096570 A1 | 7/2002 | Wong et al. |
| 2002/0120583 A1 | 8/2002 | Keresman, III et al. |
| 2003/0034388 A1 | 2/2003 | Routhenstein et al. |
| 2003/0052168 A1 | 3/2003 | Wong |
| 2003/0057278 A1 | 3/2003 | Wong |
| 2003/0116635 A1 | 6/2003 | Taban |
| 2003/0152253 A1 | 8/2003 | Wong |
| 2003/0163287 A1 | 8/2003 | Vock et al. |
| 2003/0173409 A1 | 9/2003 | Vogt et al. |
| 2003/0179909 A1 | 9/2003 | Wong et al. |
| 2003/0179910 A1 | 9/2003 | Wong |
| 2003/0226899 A1 | 12/2003 | Finkelstein |
| 2004/0035942 A1 | 2/2004 | Silverman |
| 2004/0133787 A1 | 7/2004 | Doughty |
| 2004/0162732 A1 | 8/2004 | Rahim et al. |
| 2004/0172535 A1 | 9/2004 | Jakobsson |
| 2004/0177045 A1 | 9/2004 | Brown |
| 2005/0043997 A1 | 2/2005 | Sahota et al. |
| 2005/0080747 A1 | 4/2005 | Anderson et al. |
| 2005/0086160 A1 | 4/2005 | Wong et al. |
| 2005/0086177 A1 | 4/2005 | Anderson et al. |
| 2005/0116026 A1 | 6/2005 | Burger et al. |
| 2005/0119940 A1 | 6/2005 | Concilio et al. |
| 2005/0154643 A1 | 7/2005 | Doan et al. |
| 2005/0212406 A1* | 9/2005 | Daniels et al. ............... 313/503 |
| 2005/0228959 A1 | 10/2005 | D'Albore et al. |
| 2006/0000900 A1 | 1/2006 | Fernandes et al. |
| 2006/0037073 A1 | 2/2006 | Juels et al. |
| 2006/0041759 A1 | 2/2006 | Kaliski et al. |
| 2006/0085328 A1 | 4/2006 | Cohen et al. |
| 2006/0091223 A1 | 5/2006 | Zellner |
| 2006/0161435 A1 | 7/2006 | Atef et al. |
| 2006/0163353 A1 | 7/2006 | Moulette et al. |
| 2006/0174104 A1 | 8/2006 | Crichton et al. |
| 2006/0196931 A1 | 9/2006 | Holtmanns et al. |
| 2006/0231611 A1 | 10/2006 | Chakiris et al. |
| 2006/0256961 A1 | 11/2006 | Brainard et al. |
| 2007/0034700 A1 | 2/2007 | Poidomani et al. |
| 2007/0114274 A1 | 5/2007 | Gibbs et al. |
| 2007/0124321 A1 | 5/2007 | Szydlo |
| 2007/0152070 A1 | 7/2007 | D'Albore |
| 2007/0152072 A1 | 7/2007 | Frallicciardi et al. |
| 2007/0153487 A1 | 7/2007 | Frallicciardi et al. |
| 2007/0174614 A1 | 7/2007 | Duane et al. |
| 2007/0241183 A1 | 10/2007 | Brown et al. |
| 2007/0241201 A1 | 10/2007 | Brown et al. |
| 2007/0256123 A1 | 11/2007 | Duane et al. |
| 2007/0192249 A1 | 12/2007 | Biffle et al. |
| 2007/0291753 A1 | 12/2007 | Romano |
| 2008/0005510 A1 | 1/2008 | Sepe et al. |
| 2008/0008315 A1 | 1/2008 | Fontana et al. |
| 2008/0008322 A1 | 1/2008 | Fontana et al. |
| 2008/0010675 A1 | 1/2008 | Massacusa et al. |
| 2008/0016351 A1 | 1/2008 | Fontana et al. |
| 2008/0019507 A1 | 1/2008 | Fontana et al. |
| 2008/0028447 A1 | 1/2008 | O'Malley et al. |
| 2008/0040271 A1 | 2/2008 | Hammad et al. |
| 2008/0040276 A1 | 2/2008 | Hammad et al. |
| 2008/0058016 A1 | 3/2008 | Di Maggio et al. |
| 2008/0059379 A1 | 3/2008 | Ramaci et al. |
| 2008/0096326 A1 | 4/2008 | Reed |
| 2008/0126398 A1 | 5/2008 | Cimino |
| 2008/0128515 A1 | 6/2008 | Di Iorio |
| 2008/0148394 A1 | 6/2008 | Poidomani et al. |
| 2008/0201264 A1 | 8/2008 | Brown et al. |
| 2008/0209550 A1 | 8/2008 | Di Iorio |
| 2008/0288699 A1 | 11/2008 | Chichierchia |
| 2008/0294930 A1 | 11/2008 | Varone et al. |
| 2008/0302877 A1 | 12/2008 | Musella et al. |
| 2009/0013122 A1 | 1/2009 | Sepe et al. |
| 2009/0036147 A1 | 2/2009 | Romano |
| 2009/0046522 A1 | 2/2009 | Sepe et al. |
| 2009/0108064 A1 | 4/2009 | Fernandes et al. |
| 2009/0150295 A1 | 6/2009 | Hatch et al. |
| 2009/0152365 A1 | 6/2009 | Li et al. |
| 2009/0242648 A1 | 10/2009 | Di Sirio et al. |
| 2009/0244858 A1 | 10/2009 | Di Sirio et al. |
| 2009/0253460 A1 | 10/2009 | Varone et al. |
| 2009/0255996 A1 | 10/2009 | Brown et al. |
| 2009/0290704 A1 | 11/2009 | Cimino |
| 2009/0303885 A1 | 12/2009 | Longo |
| 2010/0230793 A1 | 9/2010 | Kudose et al. |
| 2010/0316841 A1* | 12/2010 | Geuens ..................... 428/137 |
| 2011/0028184 A1 | 2/2011 | Cooper |
| 2011/0193449 A1* | 8/2011 | Phan Le et al. ............ 310/317 |
| 2011/0316158 A1* | 12/2011 | Chin et al. ................. 257/741 |

FOREIGN PATENT DOCUMENTS

| | | |
|---|---|---|
| WO | WO0247019 | 6/2002 |
| WO | WO06066322 | 6/2006 |
| WO | WO06080929 | 8/2006 |
| WO | WO06105092 | 10/2006 |
| WO | WO06116772 | 11/2006 |
| WO | WO08064403 | 6/2008 |

OTHER PUBLICATIONS

Troxtell et al., Semiconductor Packing Methodology, Texas Instruments Application Report, Sep. 2005, pp. 1-29.*
U.S. Appl. No. 60/594,300, Poidomani et al.
U.S. Appl. No. 60/675,388, Poidomani et al.
The Bank Credit Card Business. Second Edition, American Bankers Association, Washington, D.C., 1996.
A Day in the Life of a Flux Reversal. http://www.phrack.org/issues.html?issue=37&id=6#article. As viewed on Apr. 12, 2010.
Dynamic Virtual Credit Card Numbers. http://homes.cerias.purdue.edu/~jtli/paper/fc07.pdf. As viewed on Apr. 12, 2010.
English translation of JP 05210770 A.
USPTO, International Search Report, dated Jun. 28, 2013.

* cited by examiner

US 9,916,992 B2

SYSTEMS AND METHODS FOR FLEXIBLE COMPONENTS FOR POWERED CARDS AND DEVICES

CROSS-REFERENCE TO RELATED APPLICATION

This application claims the benefit of U.S. Provisional Patent Application No. 61/600,950, titled "SYSTEMS AND METHODS FOR FLEXIBLE COMPONENTS FOR POWERED CARDS AND DEVICES," filed Feb. 20, 2012, which is hereby incorporated by reference herein in its entirety.

BACKGROUND OF THE INVENTION

This invention relates to powered cards and devices and related systems.

SUMMARY OF THE INVENTION

A card may include a dynamic magnetic communications device, which may take the form of a magnetic encoder or a magnetic emulator. A magnetic encoder, for example, may be utilized to modify information that is located on a magnetic medium, such that a magnetic stripe reader may then be utilized to read the modified magnetic information from the magnetic medium. A magnetic emulator, for example, may be provided to generate electromagnetic fields that directly communicate data to a read-head of a magnetic stripe reader. A magnetic emulator, for example, may communicate data serially to a read-head of the magnetic stripe reader. A magnetic emulator, for example, may communicate data in parallel to a read-head of the magnetic stripe reader.

All, or substantially all, of the front surface, as well as the rear surface, of a card may be implemented as a display (e.g., bi-stable, non bi-stable, LCD, or electrochromic display). Electrodes of a display may be coupled to one or more touch sensors, such that a display may be sensitive to touch (e.g., using a finger or a pointing device) and may be further sensitive to a location of the touch. The display may be sensitive, for example, to objects that come within a proximity of the display without actually touching the display.

A dynamic magnetic stripe communications device may be implemented on a multiple layer board (e.g., a two-layer flexible printed circuit board). A coil for each track of information that is to be communicated by the dynamic magnetic stripe communications device may then be provided by including wire segments on each layer and interconnecting the wire segments through layer interconnections to create a coil. For example, a dynamic magnetic stripe communications device may include two coils such that two tracks of information may be communicated to two different read-heads included in a read-head housing of a magnetic stripe reader. A dynamic magnetic communications device may include, for example, three coils such that three tracks of information may be communicated to three different read-heads included in a read-head housing of a magnetic stripe reader.

Input and/or output devices may be included on a card, for example, to facilitate data exchange with the card. For example, an integrated circuit (IC) may be included on a card and exposed from the surface of the card. Such a chip (e.g., an EMV chip) may communicate information to a chip reader (e.g., an EMV chip reader). An RFID antenna or module may be included on a card, for example, to send and/or receive information between an RFID writer/reader and the RFID included on the card.

One or more detectors may be provided on a card, for example, to sense the presence of an external object, such as a person or device, which in turn, may trigger the initiation of a communication sequence with the external object. The sensed presence of the external object may then be communicated to a processor of the card, which in turn may direct the exchange of information between a card and the external object. Accordingly, timing aspects of the information exchange between an external object and the various I/O devices provided on a card may also be determined by circuitry (e.g., a processor) provided on a card.

The sensed presence of the external object or device may include the type of object or device that is detected and, therefore, may then determine the type of communication that is to be used with the detected object or device. For example, a detected object may include a determination that the object is a read-head housing of a magnetic stripe reader. Such an identifying detection, for example, may activate a dynamic magnetic stripe communications device so that information may be communicated to the read-head of the magnetic stripe reader. Information may be communicated by a dynamic magnetic stripe communications device, for example, by re-writing magnetic information on a magnetic medium that is able to be read by a magnetic stripe reader or electromagnetically communicating data to the magnetic stripe reader.

One or more read-head detectors, for example, may be provided on a card. The one or more read-head detectors may be provided as, for example, conductive pads that may be arranged along a length of a card having a variety of shapes. A property (e.g., a capacitance magnitude) of one or more of the conductive pads may, for example, change in response to contact with and/or the presence of an object.

A card may, for example, be formed as a laminate structure of two or more layers. A card may, for example, include top and bottom layers of a plastic material (e.g., a polymer). Electronics package circuitry (e.g., one or more printed circuit boards, a dynamic magnetic stripe communications device, a battery, a display, a stacked-die processor, other stacked-die components, wire-bond interconnects, ball grid array interconnects, and buttons) may be sandwiched between top and bottom layers of a laminate structure of a card. A material (e.g., a polyurethane-based or silicon-based substance) may be injected between top and bottom layers and cured (e.g., solidified by an exposure to light, chemicals, or air) to form a hardened card that may include a flexible laminate structure having stacked structures sandwiched between layers of laminate.

A processor, application specific integrated circuit (ASIC), or other circuitry may, for example, be implemented on a semiconductor die. Such a die may, for example, be made to be thinner than its original thickness (e.g., by utilizing a grinding and/or polishing process). A die may, for example, be modified to a thickness of between approximately 20 microns and 0.010 inches. A die may, for example, be modified to a preferable thickness of between approximately 0.00025 inches and 0.004 inches.

Modifying a thickness (e.g., via a grinding or polishing process) of a die may, for example, render a modified die having flexibility attributes. For example, a thinner die may exhibit a minimum bend radius or maximum bend angle without damaging the components on the die. Accordingly, for example, a flexible die may be encapsulated between two flexible sheets of lamination to form a flexible card or device, which may be flexed to a minimum bend radius without damaging the die. In so doing, for example, the flexible die may be rolled to a maximum bend angle without damaging the die. Alternately, for example, such flexible die may be arranged on a tape reel and rolled for storage. Once needed, a machine (e.g., a pick-and-place machine) may retrieve the flexible die by unrolling the tape reel and extracting the die from the tape reel to apply them to a mechanical carrier (e.g., a printed circuit board).

An operation of a flexible card or device may be altered when the card or device is flexed. For example, bending a card or device while the card or device is in operation may cause the card or device to function differently (e.g., an oscillator on the card or device may oscillate at a slightly different frequency as compared to operation when the card or device is not being flexed). A processor on the card or device (e.g., a software routine executing on the processor) may detect the change in operation and may cause a reactive change to occur based on the change in operation.

Alternately, for example, a piezoelectric device may be used to detect flexing and a software component on the card or device may drive the resultant change in operation of a flexible card or device. Other alternatives may, for example, use redundant components (e.g., geographically spaced oscillators or piezoelectric devices) to detect portions of a card or device that are being flexed (e.g., components in the flexed area change their operation) and other portions of the card or device that are not being flexed (e.g., components in the non-flexed area do not change their operation). Still other alternatives may, for example, utilize thicker, non-flexible components and thinner, flexible components and compare the difference in operation between the flexible and non-flexible components to detect that a card or device may be flexing.

Decreasing a thickness of a die may, for example, allow two or more die to be stacked on top of one another without exceeding a height limit of the card or device. For example, multiple die may be ground to a thickness of between approximately 0.003 inches and 0.005 inches (e.g., approximately 0.004 inches) and may be stacked on top of one another. Accordingly, for example, two die may be stacked together to form a stacked assembly having a thickness of between approximately 0.006 and 0.010 inches (e.g., approximately 0.008 inches). Alternately, for example, three die may be stacked together to form a stacked assembly having a thickness of between approximately 0.010 and 0.014 inches (e.g., approximately 0.012 inches).

Stacked die may be arranged on a mechanical carrier (e.g., a PCB) from bottom to top in order of decreasing diameters. For example, a bottom die may exhibit a larger diameter than a die that is stacked on top of the bottom die. Accordingly, for example, interconnections (e.g., wire bonds) may be extended from the top die to the bottom die, from the bottom die to the underlying PCB and/or from the top die to the underlying PCB. Alternately, for example, chip-to-chip interconnections (e.g., flip-chip ball grid arrays) may be used to interconnect the stacked die and/or the underlying PCB.

BRIEF DESCRIPTION OF THE DRAWINGS

The principles and advantages of the present invention can be more clearly understood from the following detailed description considered in conjunction with the following drawings, in which the same reference numerals denote the same structural elements throughout, and in which.

DETAILED DESCRIPTION OF THE INVENTION

Figure 1:
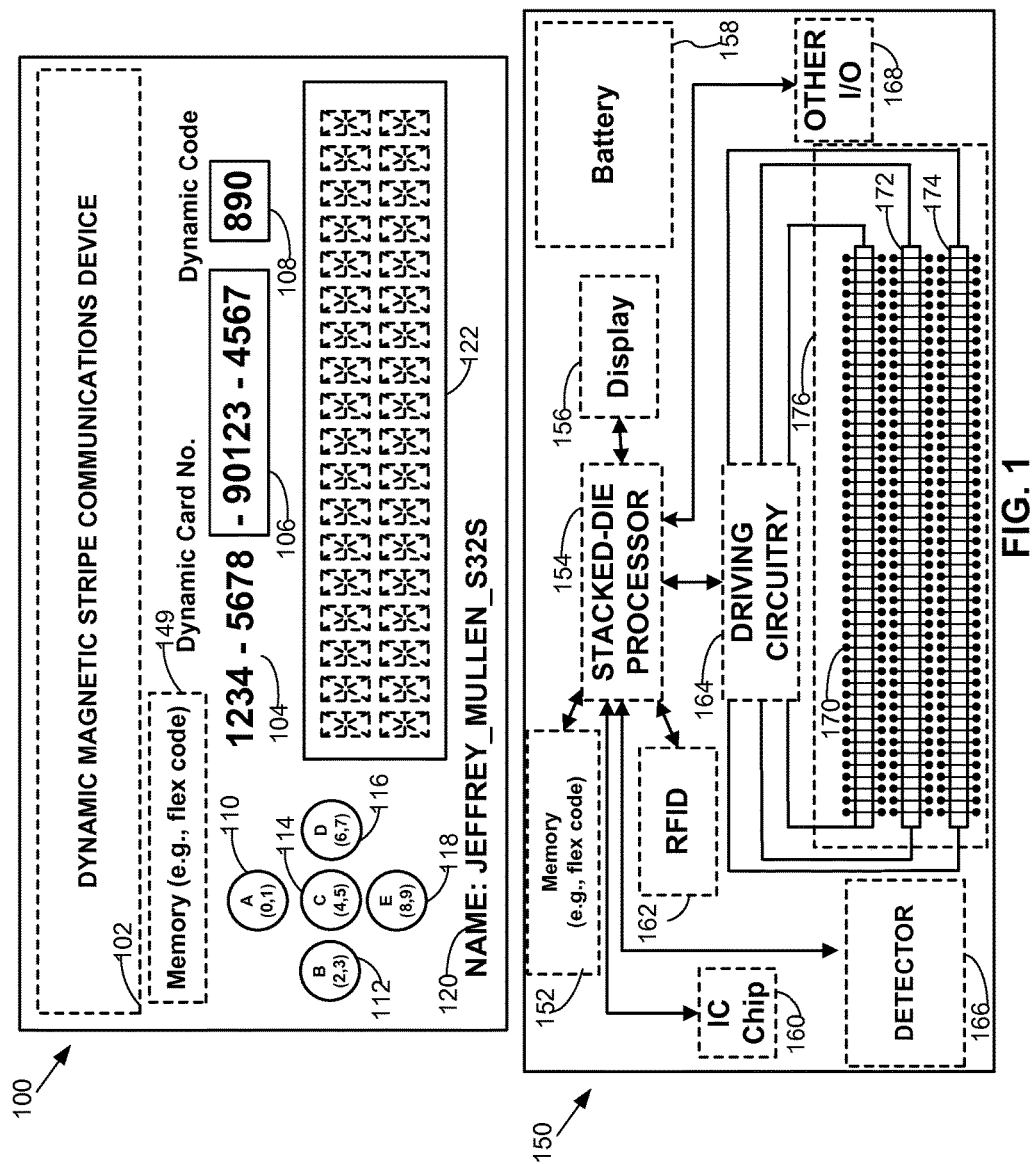
FIG. 1 is an illustration of a card constructed in accordance with the principles of the present invention.

FIG. 1 shows card 100 that may include, for example, a dynamic number that may be entirely, or partially, displayed using a display (e.g., display 106). A dynamic number may include a permanent portion such as, for example, permanent portion 104 and a dynamic portion such as, for example, dynamic portion 106. Card 100 may include a dynamic number having permanent portion 104 and permanent portion 104 may be incorporated on card 100 so as to be visible to an observer of card 100. For example, labeling techniques, such as printing, embossing, laser etching, etc., may be utilized to visibly implement permanent portion 104.

Card 100 may include a second dynamic number that may be entirely, or partially, displayed via a second display (e.g., display 108). Display 108 may be utilized, for example, to display a dynamic code such as a dynamic security code. Card 100 may also include third display 122 that may be used to display graphical information, such as logos and barcodes. Third display 122 may also be utilized to display multiple rows and/or columns of textual and/or graphical information.

Persons skilled in the art will appreciate that any one or more of displays 106, 108, and/or 122 may be implemented as a bi-stable display. For example, information provided on displays 106, 108, and/or 122 may be stable in at least two different states (e.g., a powered-on state and a powered-off state). Any one or more of displays 106, 108, and/or 122 may be implemented as a non-bi-stable display. For example, the display is stable in response to operational power that is applied to the non-bi-stable display. Other display types, such as LCD or electro-chromic, may be provided as well.

Other permanent information, such as permanent information 120, may be included within card 100, which may include user specific information, such as the cardholder's name or username. Permanent information 120 may, for example, include information that is specific to card 100 (e.g., a card issue date and/or a card expiration date). Information 120 may represent, for example, information that includes information that is both specific to the cardholder, as well as information that is specific to card 100.

Card 100 may accept user input data via any one or more data input devices, such as buttons 110-118. Buttons 110-118 may be included to accept data entry through mechanical distortion, contact, or proximity. Buttons 110-118 may be responsive to, for example, induced changes and/or deviations in light intensity, pressure magnitude, or electric and/or magnetic field strength. Such information exchange may then be determined and processed by a processor of card 100 as data input.

Card 100 may be flexible. Card 100 may, for example, contain hardware and/or software (e.g., flex code stored in memory 152) that when executed by a processor of card 100 may detect when card 100 is being flexed. Flex code 152 may, for example, provide processor executable applications that may detect a change in operation of card 100 based on the flexed condition of card 100 and may alter functions of card 100 based on the detected change in operation.

FIG. 1 shows architecture 150, which may include one or more processors (e.g., in stacked-die processor arrangement 154). Stacked-die processor 154 may be configured to utilize external memory 152, internal memory of stacked-die processor 154, or a combination of external memory 152 and internal memory for dynamically storing information, such as executable machine language (e.g., flex code), related dynamic machine data, and user input data values. Stacked-die processor 154 may, for example, execute code contained within memory 152 to detect when a card (e.g., card 100 of FIG. 1) is being flexed. The executed code may, for example, change the operation of a card (e.g., card 100 of FIG. 1) based on the detected change in operation.

Stacked-die processor 154 may be a combination of two or more die stacked on top of one another. The stacked arrangement may, for example, be attached to a mechanical carrier (e.g., a PCB) where a bottom die may exhibit a larger diameter than a die stacked on top of the bottom die. Accordingly, for example, interconnections (e.g., wire bonds) may be placed from one die to another die and/or from each die to the underlying PCB. Alternately, for example, stacked-die processor 154 may be a flip-chip combination, where die-to-die and/or die-to-PCB connections may be established using through-die connections and associated interconnections (e.g., a ball grid array). In so doing, for example, each of the stacked die may exhibit the same or different diameters.

One or more of the components shown in architecture 150 may be configured to transmit information to stacked-die processor 154 and/or may be configured to receive information as transmitted by stacked-die processor 154. For example, one or more displays 156 may be coupled to receive data from stacked-die processor 154. The data received from stacked-die processor 154 may include, for example, at least a portion of dynamic numbers and/or dynamic codes.

One or more displays 156 may be, for example, touch sensitive and/or proximity sensitive. For example, objects such as fingers, pointing devices, etc., may be brought into contact with displays 156, or in proximity to displays 156. Detection of object proximity or object contact with displays 156 may be effective to perform any type of function (e.g., transmit data to stacked-die processor 154). Displays 156 may have multiple locations that are able to be determined as being touched, or determined as being in proximity to an object.

Input and/or output devices may be implemented on architecture 150. For example, integrated circuit (IC) chip 160 (e.g., an EMV chip) may be included within architecture 150, that may communicate information to a chip reader (e.g., an EMV chip reader). Radio frequency identification (RFID) module 162 may be included within architecture 150 to enable the exchange of information with an RFID reader/writer.

Other input and/or output devices 168 may be included within architecture 150, for example, to provide any number of input and/or output capabilities. For example, other input and/or output devices 168 may include an audio device capable of receiving and/or transmitting audible information.

Other input and/or output devices 168 may include a device that exchanges analog and/or digital data using a visible data carrier. Other input and/or output devices 168 may include a device, for example, that is sensitive to a non-visible data carrier, such as an infrared data carrier or an electromagnetic data carrier.

Persons skilled in the art will appreciate that a card (e.g., card 100 of FIG. 1) may, for example, contain stacked-die components on a mechanical carrier (e.g., a PCB) other than stacked-die processor 154. RFID 162, IC chip 160, memory 153, and/or other I/O 168 may, for example, each be implemented on a semiconductor die. Two or more of such components may be stacked and interconnected via wire-bonding, ball grid array, or other connection types. Accordingly, for example, surface area on the PCB may be conserved by adding components in vertical fashion rather than adding components laterally across the surface area of the PCB.

Persons skilled in the art will further appreciate that a card (e.g., card 100 of FIG. 1) may, for example, be a self-contained device that derives its own operational power from one or more batteries 158. Furthermore, one or more batteries 158 may be included, for example, to provide operational power for a period of time (e.g., approximately 2-4 years). One or more batteries 158 may be included, for example, as rechargeable batteries.

Electromagnetic field generators 170-174 may be included within architecture 150 to communicate information to, for example, a read-head of a magnetic stripe reader via, for example, electromagnetic signals. For example, electromagnetic field generators 170-174 may be included to communicate one or more tracks of electromagnetic data to read-heads of a magnetic stripe reader. Electromagnetic field generators 170-174 may include, for example, a series of electromagnetic elements, where each electromagnetic element may be implemented as a coil wrapped around one or more materials (e.g., a magnetic material and/or a non-magnetic material). Additional materials may be placed outside the coil (e.g., a magnetic material and/or a non-magnetic material).

Electrical excitation by stacked-die processor 154 of one or more coils of one or more electromagnetic elements via, for example, driving circuitry 164 may be effective to generate electromagnetic fields from one or more electromagnetic elements. One or more electromagnetic field generators 170-174 may be utilized to communicate electromagnetic information to, for example, one or more read-heads of a magnetic stripe reader.

Timing aspects of information exchange between architecture 150 and the various I/O devices implemented within architecture 150 may be determined by stacked-die processor 154. Detector 166 may be utilized, for example, to sense the proximity and/or actual contact, of an external device, which in turn, may trigger the initiation of a communication sequence. The sensed presence and/or touch of the external device may then be communicated to a controller (e.g., stacked-die processor 154), which in turn may direct the exchange of information between architecture 150 and the external device. The sensed presence and/or touch of the external device may be effective to, for example, determine the type of device or object detected.

For example, the detection may include the detection of, for example, a read-head of a magnetic stripe reader. In response, stacked-die processor 154 may activate one or more electromagnetic field generators 170-174 to initiate a communications sequence with, for example, one or more read-heads of a magnetic stripe reader. The timing relationships associated with communications between one or more electromagnetic field generators 170-174 and one or more read-heads of a magnetic stripe reader may be provided through use of the detection of the magnetic stripe reader.

Persons skilled in the art will appreciate that stacked-die processor 154 may provide user-specific and/or card-specific information through utilization of any one or more of buttons 110-118, RFID 162, IC chip 160, electromagnetic field generators 170-174, and other input and/or output devices 168.

Figure 2:
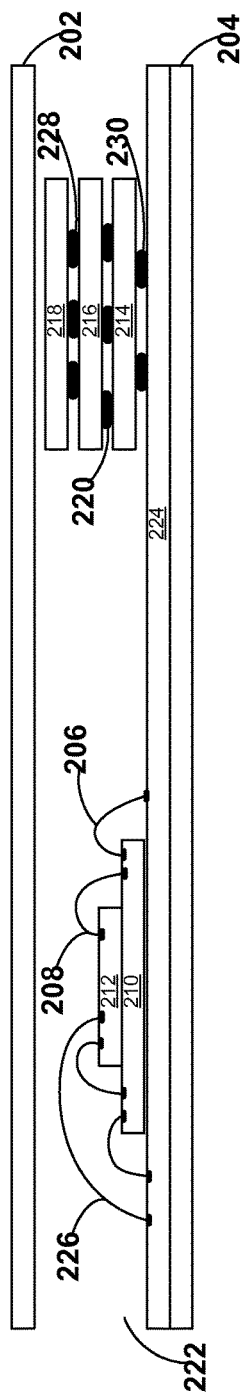
FIG. 2 is an illustration of a card constructed in accordance with the principles of the present invention.

FIG. 2 shows card 200. Card 200 may, for example, include a layer of plastic (e.g., polymer layer 202) that may be approximately between 0.003 inches and 0.007 inches (e.g., approximately 0.005 inches) thick. Card 200 may, for example, include a layer of plastic (e.g., polymer layer 204) that may be approximately between 0.003 inches and 0.007 inches (e.g., approximately 0.005 inches) thick.

Card 200 may include stacked-die components 210-218. Stacked-die components 210-218 may, for example, include processors, ASICs, mixed-signal devices, transistor devices, and any other device. Stacked-die components 210-218 may, for example, be thinned (e.g., via a grinding or polishing process). Such a thinning process may reduce a thickness of stacked-die components 210-218 to a thickness of between approximately 20 microns and 0.010 inches. A thickness of a die may be thinned to approximately between 0.00025 inches and 0.008 inches (e.g., approximately 0.004 inches). Stacked-die components 210-218 may be attached to a mechanical carrier (e.g., PCB 224).

Mechanical and/or electrical interconnections between die 210 and die 212 may, for example, include wire-bonds 208. Mechanical and/or electrical interconnections between die 210 and PCB 224 may, for example, include wire-bonds 206. Mechanical and/or electrical interconnections between die 212 and PCB 224 may, for example, include wire-bonds 226. Die 212 may exhibit a smaller diameter as compared to die 210. Accordingly, for example, wire-bond connections between die 210 and 212, between die 210 and PCB 224, and between die 212 and PCB 224 may be facilitated. A top-down (e.g., birds-eye) view (not shown) of die 210, die 212, and PCB 224 may, for example, illustrate that interconnect pads associated with wire bonds 206, 208, and 226 may be staggered so as to substantially reduce a possibility of shorting bonding wires to interconnect pads not associated with such bonding wires.

Electrical and/or mechanical interconnections between die 214 and die 216 may, for example, include flip-chip solder balls 220 of a ball grid array. Electrical and/or mechanical interconnections between die 216 and die 218 may, for example, include flip-chip solder balls 228 of a ball grid array. Electrical and/or mechanical interconnections between die 214 and PCB 224 may, for example, include flip-chip solder balls 230 of a ball grid array. Accordingly, for example, die 214, 216, and 218 may exhibit the same, or different, diameters.

Through-die vias may, for example, provide electrical connectivity between any one or more die 214-218 and PCB 224. For example, electrical signals may be communicated between die 218 and 216, between die 218 and 214, between die 216 and 214 and between any one or more of die 214-218 and PCB 224 using conductive vias that may extend through die 214-218 and may be electrically interconnected via solder balls 220, 228 and/or 230 of their respective ball grid arrays.

Card 200 may include an encapsulant, which may include a layer of material 222 (e.g., a material formed from one or more polyurethane-based or silicon-based substances). Material 222 may be a substance that changes its physical state (e.g., changes from a liquid substance to a solid substance) when cured by one or more conditions (e.g., air, heat, pressure, light, or chemicals) for a period of time. Accordingly, for example, card 200 may be hardened, but may remain flexible, so that card 200 may be flexed to exhibit either of a convex or concave shape, while returning to a substantially flat orientation once flexing ceases.

Figure 3:
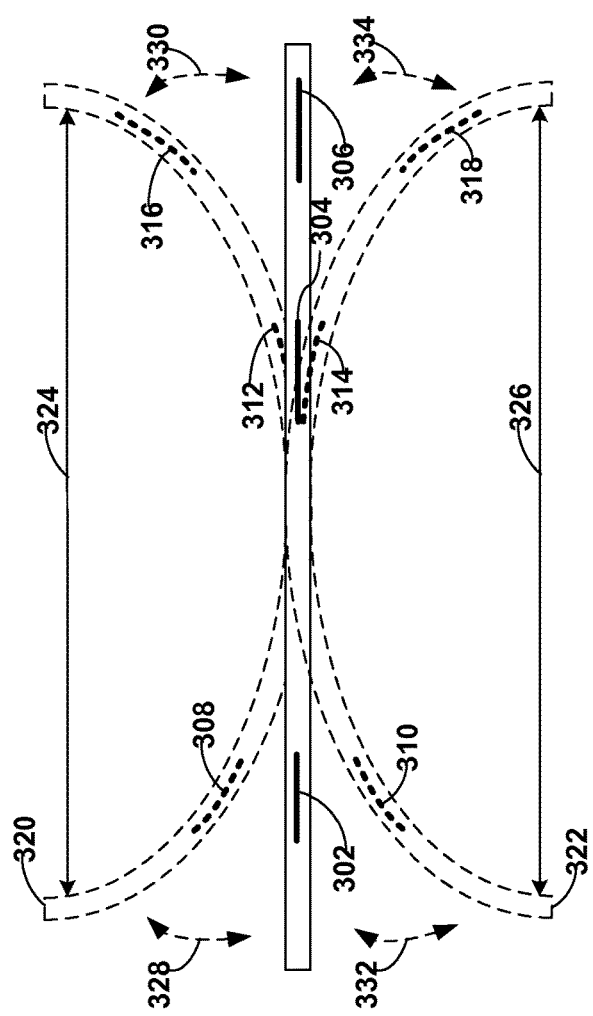
FIG. 3 is an illustration of a card constructed in accordance with the principles of the present invention.

FIG. 3 shows card or device 300. Card or device 300 may, for example, be a laminated assembly, which may include top and bottom layers of a plastic (e.g., polymer top and bottom layers) with components 302, 304 and 306 encapsulated there between. An encapsulant of card or device 300 may be cured (e.g., hardened) such that card or device 300 may be rigid, yet flexible.

Components 302-306 may be electrical devices (e.g., stacked or non-stacked die) and/or mechanical devices (e.g., buttons) that may be flexible, such that when card or device 300 is flexed, components 302-306 may also flex. Card or device 300 may, for example, include other devices (not shown) that may not be flexible. Accordingly, for example, those devices of card or device 300 that may flex when card or device is flexed may also change their operation as compared to those devices that do not flex. In so doing, for example, detectors (not shown) may be placed within card or device 300 to detect such a change in operation and may take some action based upon such a detected change in operation.

Card or device 300 may be flexed in direction 328 and/or 330 to bend card or device 300 into a concave orientation having minimum bend radius 324. Components 302-306 may assume positions 308, 312 and 316, respectively, as a result of such flexing. Components 302-306 may exhibit an adequately reduced thickness (e.g., via a grinding or polishing process) such that flexing does not destroy the operation of components 302-306 and may or may not change the operation of components 302-306.

Card or device 300 may be flexed in direction 332 and/or 334 to bend card or device 300 into a convex orientation having minimum bend radius 326. Components 302-306 may assume positions 310, 314, and 318, respectively, as a result of such flexing. Components 302-306 may exhibit an adequately reduced thickness (e.g., via a grinding or polishing process) such that flexing does not destroy the operation of components 302-306 and may or may not change the operation of components 302-306.

Figure 4:
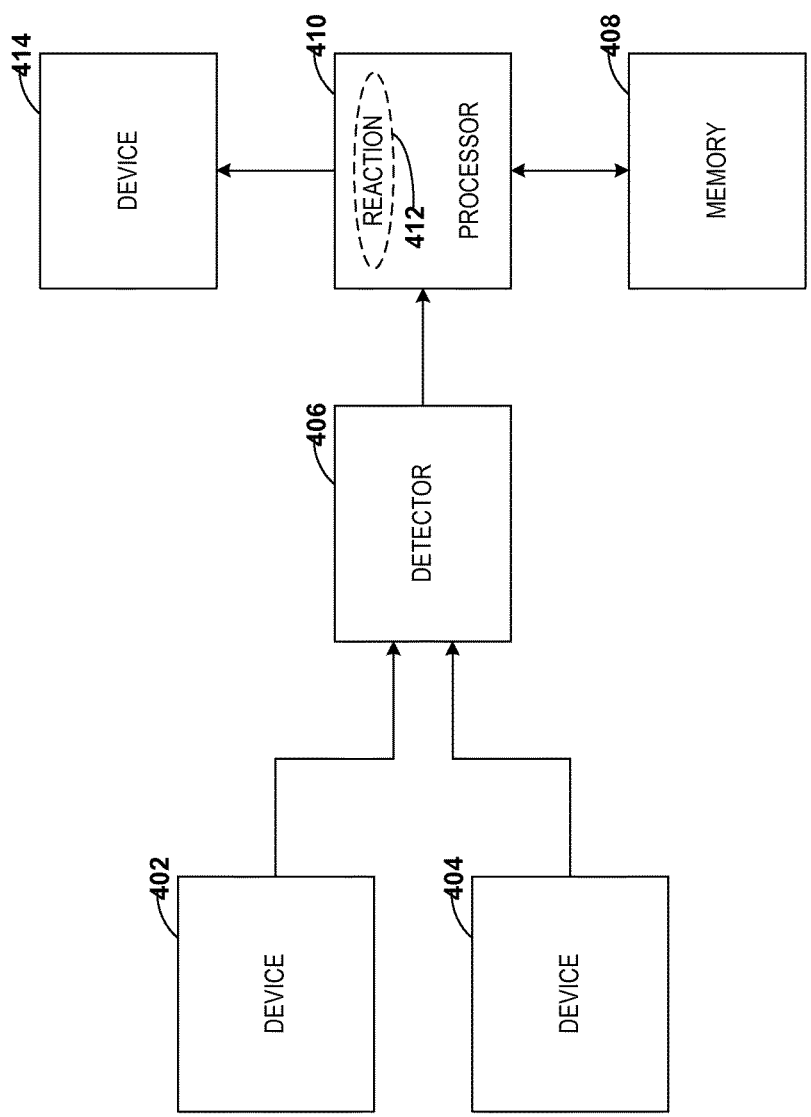
FIG. 4 is an illustration of a system constructed in accordance with the principles of the present invention.

FIG. 4 shows system 400 of a card or device, which may include devices 402 and 404, detector 406, processor 410, memory 408, reaction process 412, and device 414. Devices 402 and 404 may, for example, be devices that may be geographically spaced apart from one another on a card or device. Devices 402 and 404 may, for example, be devices whose operation may change when flexed. For example, devices 402 and 404 may be provided on one or more die, where each die may exhibit a thickness between approximately 0.00025 inches and 0.007 inches (e.g., approximately 0.004 inches). Further, devices 402 and 404 may be mounted on a mechanical carrier (e.g., a PCB) that may also be flexible. Accordingly, for example, devices 402 and 404 may be flexed during operation of system 400. In so doing, for example, the operation of devices 402 and 404 may change based upon such flexing.

Detector 406 may, for example, sample an output of device 402 and/or device 404 to determine whether device 402 and/or device 404 are being flexed during operation. Device 402 and/or device 404 may, for example, be provided as an oscillating device (e.g., an oscillator or piezoelectric device). Accordingly, for example, an oscillation frequency of such devices may change and such a change in oscillation frequency may be detected by detector 406.

The detected change in operation may, for example, be reported to processor 410, which may be executing code (e.g., flex code), which may be resident within memory 408. Accordingly, for example, a software process (e.g., reaction process 412) executing on processor 410 may receive a detected change in operation from detector 406 that may be based upon a detected flexing of system 400 (e.g., the operation of device 402 and/or device 404 may change when a card or device is flexed) and may initiate a reaction (e.g., a reaction initiated by reaction process 412) that may be based upon the detected change in operation. Reaction process 412 may, for example, control an operation of device 414 based upon the detected change in operation of device 402 and/or device 404.

A geographic separation of device 402 and device 404 on a card or device may, for example, allow detector 406 to determine whether specific geographic regions of a card or device are being flexed. For example, detector 406 may detect a change in operation of device 402, but may detect no change in operation of device 404 while the card or device is being flexed. Accordingly, for example, reaction process 412, as executed by processor 410, may determine that the geographic region of device 402 is being flexed while the geographic region of device 404 is not being flexed. In so doing, for example, reaction process 412 may effect a change in operation of a device (e.g., device 414) based upon a change in operation of device 402.

In an alternate example, device 402 and device 404 may exist in the same geographic region of a card or device. Device 402 may, for example, be a non-flexible device. Device 404 may, for example, be a flexible device. Accordingly, for example, while a card or device is being flexed, an operation of device 402 may not change while an operation of device 404 may change. Such a difference in operation may be detected by detector 406. In so doing, for example, reaction process 412, as executed by processor 410, may determine that a difference in operation between devices 402 and 404 exists and may alter an operation of a device (e.g., device 414) based upon such a difference in operation.

Figure 5:
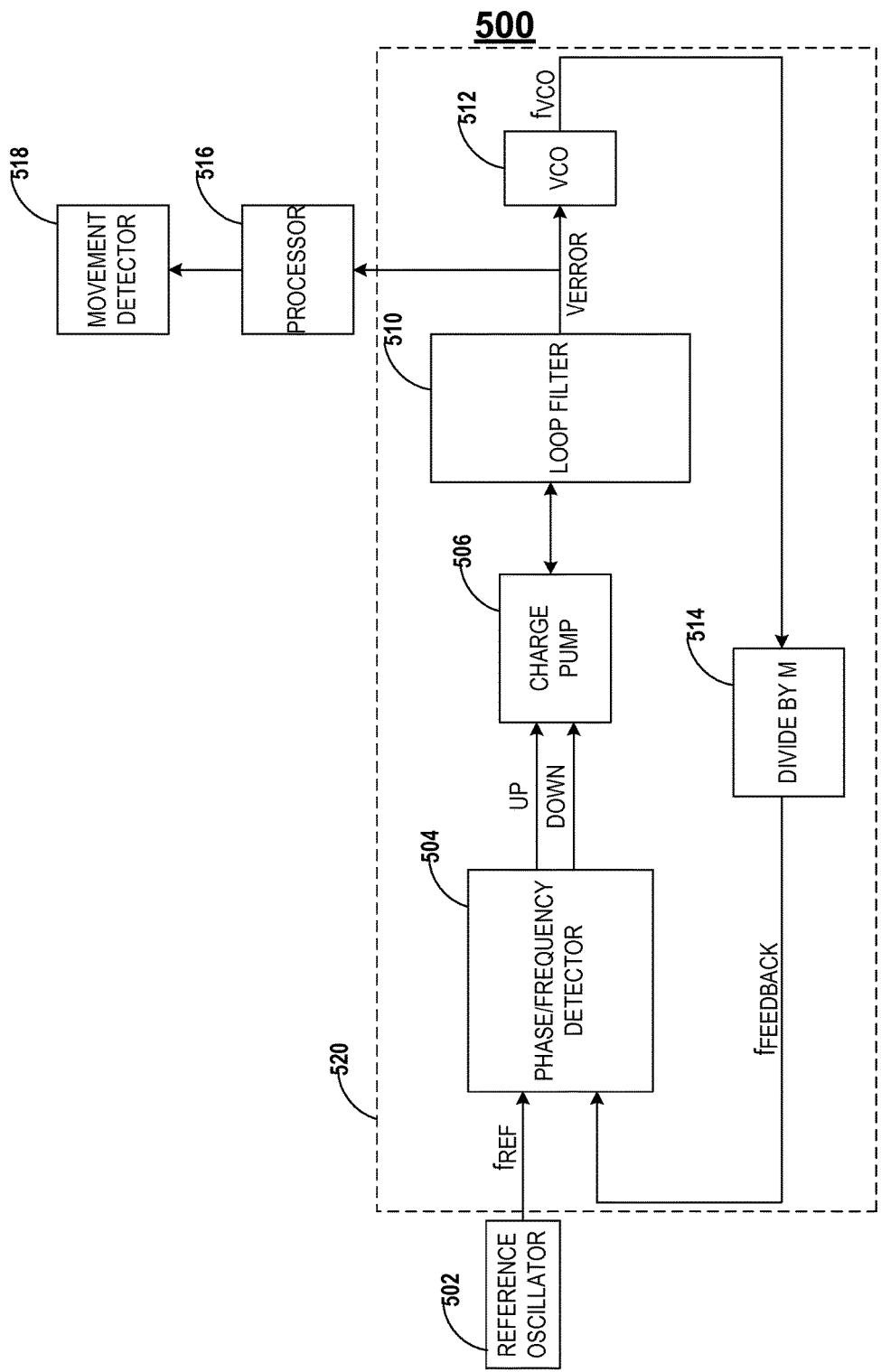
FIG. 5 is an illustration of a system constructed in accordance with the principles of the present invention.

FIG. 5 shows system 500 that may, for example, provide a detected change in operation of a flexed component (e.g., reference oscillator 502) of a flexed card or device. System 500 may include a phase locked loop (e.g., PLL 520) that may include phase/frequency detector 504, charge pump 506, loop filter 510, VCO 512, and divider 514. PLL 520 may, for example, be implemented on a die that may not flex (e.g., PLL 520 may be implemented on a thicker die as compared to a thickness of a die that reference oscillator 502 may be implemented upon). Accordingly, for example, the operation of PLL 520 may not change when the card or device that PLL 520 is implemented upon may flex. Further, for example, the operation of reference oscillator 502 may change when the card or device that reference oscillator 502 is implemented upon may flex.

In operation, phase/frequency detector 504 may provide signals (e.g., UP and DOWN), which may correspond to the phase/frequency error between $f_{REF}$ and $f_{FEEDBACK}$. For example, if the phase/frequency of the output of divider 514 is lagging signal $f_{REF}$, then a pulse width of signal UP may increase and a pulse width of signal DOWN may decrease to cause the phase/frequency of VCO 512 to be advanced in phase/frequency. Conversely, if the phase/frequency of the output of divider 514 is advanced with respect to signal $f_{REF}$, then the pulse width of signal UP may decrease and the pulse width of signal DOWN may increase to cause the phase/frequency of VCO 512 to be retarded in phase/frequency.

Charge pump 506 may react to signals UP and/or DOWN by generating an error signal. For example, if the pulse width of signal UP is increased, the magnitude of the error signal may also increase. If the pulse width of signal DOWN is increased, for example, then the magnitude of the error signal may also decrease. The error signal may, for example, be filtered by loop filter 510 and provided to VCO 512 to set the output phase/frequency, $f_{VCO}$, of VCO 512. Through negative feedback, the phase/frequency error between $f_{REF}$ and $f_{FEEDBACK}$ may be tracked and cancelled by PLL 520.

A phase/frequency error between $f_{REF}$ and $f_{FEEDBACK}$ may, for example, occur when a flexing of a card or device causes reference oscillator 502 to change its operation (e.g., to change a phase or frequency of operation of reference oscillator 502). Such a phase/frequency error may be detected by processor 516, for example, by monitoring a magnitude of signal $V_{ERROR}$. Accordingly, for example, processor 516 may detect when a component of a card or device (e.g., reference oscillator 502) changes its operation when flexed. In so doing, for example, a software application executed by processor 516 may receive the detected change in operation and may implement a reactive change in operation of another component (e.g., movement detector 518) of a card or device.

Movement detector 518 may include an orientation of conductive pads, whereby one or more conductive pads may be arranged along a length of a card or device. Movement detector 518 may, for example, detect a location of an object (e.g., a read head of a magnetic card reader) by detecting a characteristic change (e.g., a capacitance change) in relation to the conductive pads of movement detector 518. In addition, by monitoring a characteristic change (e.g., a capacitance change) associated with one or more of the conductive pads and by comparing a characteristic change of neighboring conductive pads, a position and/or velocity and/or acceleration estimate of an object moving in relation to such conductive pads may be obtained.

A frequency at which a capacitance change in the conductive pads of movement detector 518 may be sampled may, for example, be adjusted based upon a detected change in operation of reference oscillator 502. Accordingly, for example, if a decrease in a phase/frequency of operation of reference oscillator 502 is detected by processor 516 in relation to a flex event of a card or device, then processor 516 may increase a sampling frequency of movement detector 518 to compensate. Alternately, for example, if an increase in a phase/frequency of operation of reference oscillator 502 is detected by processor 516 in relation to a flex event of a card or device, then processor 516 may decrease a sampling frequency of movement detector 518 to compensate.

Figure 6:
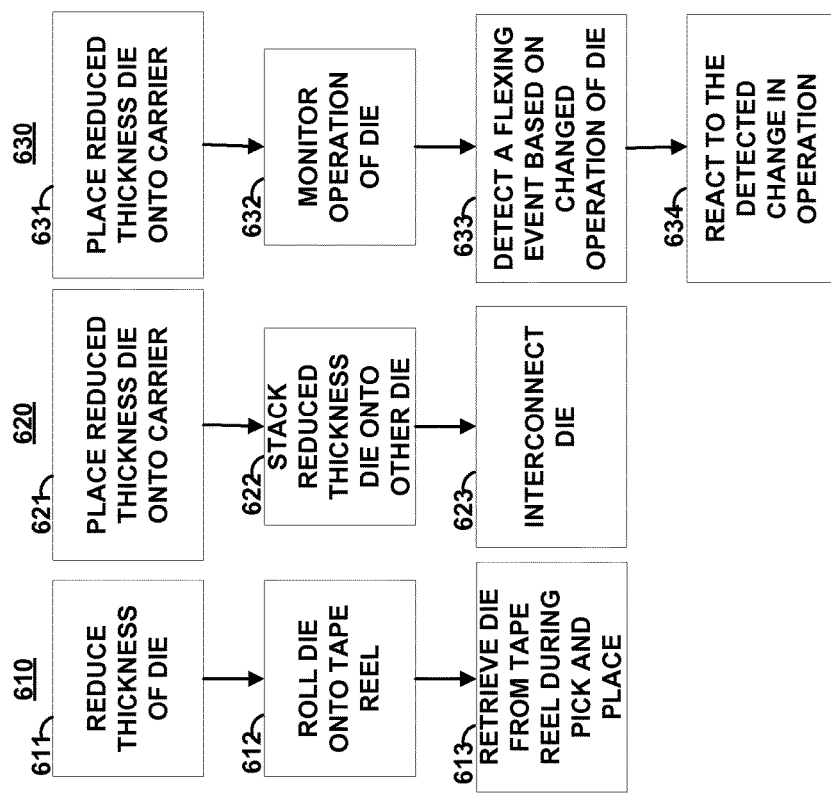
FIG. 6 is an illustration of process flow charts constructed in accordance with the principles of the present invention.

A flow diagram of process sequences is shown in FIG. 6. Step 611 of sequence 610 may, for example, reduce a thickness of one or more die by utilizing a thinning process (e.g., a grinding or polishing process). A thickness of a die may, for example, be reduced to approximately between 20 microns and 0.010 inches (e.g., approximately 0.004 inches). Such a reduced thickness die may, for example, contain components such as processors, ASICs, and mixed-mode circuitry (e.g., analog and digital circuitry). Such a reduced thickness die may, for example, exhibit increased flexibility, such that the die may be flexed to a minimum bend radius (e.g., rolled) or to a maximum bend angle. Accordingly, for example, such flexible die may be rolled onto a tape reel (e.g., as in step 612). In so doing, for example, the flexible die be retrieved from the tape reel and placed onto a mechanical carrier (e.g., a PCB) during a pick-and-place production operation (e.g., as in step 613) to produce devices, such as a powered card, a telephonic device (e.g., a cell phone), an electronic tablet, a watch, or any other device.

Step 621 of sequence 620 may, for example, place reduced thickness die onto a mechanical carrier (e.g., a PCB). One or more reduced thickness die may be stacked onto the die placed in step 621 (e.g., as in step 622). For example, a die containing a processor may be placed onto a mechanical carrier (e.g., a PCB) and another die containing an ASIC may be stacked on top of the die containing the processor. Yet another die (e.g., a die containing mixed-mode electronics or other circuitry) may be stacked onto the die containing the ASIC to yield a three-die stack. Accordingly, for example, by stacking die, surface area of the PCB may be conserved. Such a stacked-die arrangement may be used to produce devices, such as a powered card, a telephonic device (e.g., a cell phone), an electronic tablet, a watch, or any other device. Such a stacked-die arrangement may be encapsulated between two layers of laminate material (e.g., polymer material), injected with an encapsulant, and hardened to produce a rigid, yet flexible card or device.

Each of the stacked die may be interconnected to each other and/or one or more of the stacked die may be interconnected to signal traces on the PCB (e.g., as in step 623). By way of example, such interconnections may be implemented via wire bonds, whereby wires may be attached to interconnect pads of each die. Such wire bonding may be facilitated by placing larger diameter die at the bottom of the stack while placing smaller diameter die in order of decreasing diameter on top of the larger diameter die. In addition, interconnect pads may be staggered (e.g., no interconnect pads of any die or substrate may be directly adjacent to one another from a bird's eye perspective) to reduce a possibility that wire bonds may make electrical contact with interconnect pads not intended for that wire bond. Alternately, for example, each stacked die may be substantially the same diameter and may be interconnected to each other and the PCB using through-die vias and ball grid array interconnections.

Step 631 of sequence 630 may, for example, place one or more reduced thickness die onto a mechanical carrier, such as a PCB or substrate. Detection circuitry may, for example, monitor operation of the reduced thickness die to detect that the mechanical carrier (and the reduced thickness die mounted onto the mechanical carrier) may be flexed (e.g., as in step 633).

For example, reduced thickness die may be placed at different geographical regions of the mechanical carrier. Accordingly, for example, by detecting a changed operation of a flexed die (e.g., as in step 633), a processor may determine which geographical location of the mechanical carrier is being flexed.

As per another example, both a flexible die and a non-flexible die may be placed onto a mechanical carrier. By monitoring operation of both die, a flex event may be detected (e.g., as in step 633) by detecting a difference in operation between the flexible die and the non-flexible die.

In step 634, a processor of a card or device may react to a changed operation of a flexed die. For example, a card or device may be flexed such that a reference oscillator on the card or device changes frequency. A software application executed by a processor of the card or device may, for example, react to the changed frequency by adjusting an operation of another component of the card or device. As per another example, a dynamic magnetic stripe communications device may not communicate magnetic stripe data having an adequate magnitude when the associated card or device is being flexed. Accordingly, for example, a drive current provided to the dynamic magnetic stripe communications device may be increased by a software application executed by a processor of the card or device (e.g., as in step 634) based upon the detected flexing of step 633.

Persons skilled in the art will appreciate that the present invention is not limited to only the embodiments described. Instead, the present invention more generally involves dynamic information and the exchange thereof. Persons skilled in the art will also appreciate that the apparatus of the present invention may be implemented in other ways than those described herein. All such modifications are within the scope of the present invention, which is limited only by the claims that follow.

What is claimed is:

1. A method, comprising:
   reducing a thickness of a raw die;
   rolling said raw die onto a reel for storage, wherein a bend radius of said raw die on said real is greater than a minimum bend radius of a carrier on said reel;
   retrieving said raw die from said reel as part of a pick-and-place operation; and
   placing said retrieved raw die onto a carrier of a flexible device as part of said pick-and-place operation.

2. The method of claim 1, wherein said raw die is reduced in thickness to between approximately 0.00025 inches and 0.010 inches.

3. The method of claim 1, wherein said raw die is reduced in thickness to approximately 0.004 inches.

4. The method of claim 1, wherein said raw die is rolled onto said reel at about a maximum bend angle of said raw die.

5. A method, comprising:
   placing a reduced thickness raw die onto a PCB;
   flexing said PCB;
   monitoring said raw die for changed operation based on said flexing; and
   changing an operation of a component on said PCB based on said changed operation.

* * * * *